United States Patent
Takigawa et al.

(10) Patent No.: US 9,859,673 B2
(45) Date of Patent: Jan. 2, 2018

(54) LASER DEVICE PROVIDED WITH FUNCTION TO DETERMINE FEASABILITY OF OPENING DOOR

(71) Applicant: FANUC CORPORATION, Minamitsuru-gun, Yamanashi (JP)

(72) Inventors: Hiroshi Takigawa, Yamanashi (JP); Hiroyuki Yoshida, Yamanashi (JP); Akihiko Nishio, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/165,193

(22) Filed: May 26, 2016

(65) Prior Publication Data
US 2016/0352062 A1 Dec. 1, 2016

(30) Foreign Application Priority Data
Jun. 1, 2015 (JP) ................. 2015-111568

(51) Int. Cl.
| | |
|---|---|
| G08B 17/00 | (2006.01) |
| H01S 3/00 | (2006.01) |
| B23K 26/00 | (2014.01) |
| B23K 26/21 | (2014.01) |
| H01S 3/04 | (2006.01) |

(52) U.S. Cl.
CPC ............ *H01S 3/0014* (2013.01); *B23K 26/00* (2013.01); *B23K 26/21* (2015.10); *H01S 3/0407* (2013.01)

(58) Field of Classification Search
CPC ........................... H01S 3/0407; H01S 3/0014
USPC ........................................................ 340/584
See application file for complete search history.

(56) References Cited

U.S. PATENT DOCUMENTS

| | | | | |
|---|---|---|---|---|
| 2013/0324027 A1* | 12/2013 | Davis | ................... | F24F 11/0001 454/258 |
| 2014/0338883 A1* | 11/2014 | Watanabe | .............. | B60H 3/024 165/287 |
| 2015/0128628 A1* | 5/2015 | Kawagoe | ................ | F25B 13/00 62/160 |

FOREIGN PATENT DOCUMENTS

| | | |
|---|---|---|
| JP | S62159167 A | 7/1987 |
| JP | H01107286 A | 4/1989 |
| JP | H05227393 A | 9/1993 |
| JP | 06036544 A | 2/1994 |

(Continued)

OTHER PUBLICATIONS

Notification of Reasons for Refusal for Japanese Application No. 2015-111568, dated May 30, 2017, including English translation, 10 pages.

(Continued)

*Primary Examiner* — Tai T Nguyen
(74) *Attorney, Agent, or Firm* — RatnerPrestia

(57) ABSTRACT

The laser device of the present invention includes a first temperature sensor which is provided in a housing to detect the temperature of the portion to be cooled, a second temperature sensor and a humidity sensor which are provided outside the housing to respectively detect the temperature and humidity of the air outside the housing. The laser device further includes a judgment unit which judges the possibility of condensation forming on the portion to be cooled by the air outside the housing based on each of the detected results of the first temperature sensor, the second temperature sensor and the humidity sensor, and a notification unit which gives notification of the judgment result of the judgment unit, outside the housing.

9 Claims, 7 Drawing Sheets

(56) References Cited

FOREIGN PATENT DOCUMENTS

| JP | H06-32336 A | 4/1994 |
|---|---|---|
| JP | H06119083 A | 4/1994 |
| JP | 06307808 A | 11/1994 |
| JP | 2000040850 A | 2/2000 |
| JP | 2001326410 A | 11/2001 |
| JP | 2001358397 A | 12/2001 |
| JP | 2003273445 A | 9/2003 |
| JP | 2004296844 A | 10/2004 |
| JP | 2006196644 A | 7/2006 |
| JP | 2007-193857 A | 8/2007 |
| JP | 4085649 B | 5/2008 |
| JP | 2012053747 A | 3/2012 |

OTHER PUBLICATIONS

Decision to Grant A Patent issued in Japanese Patent Application 2015-111568 dated Nov. 14, 2017, 5 pages.

\* cited by examiner

LASER DEVICE PROVIDED WITH FUNCTION TO DETERMINE FEASABILITY OF OPENING DOOR

BACKGROUND OF INVENTION

The present invention relates to a laser device comprising a housing in which components are provided, sealed by a door or a detachable wall panel, and more specifically relates to a laser device comprising a cooler which is provided in the housing to cool a heat generating component.

DESCRIPTION OF RELATED ART

In a high-power laser device such as a semiconductor laser device or a carbon dioxide laser device, a large amount of heat is generated from the laser source such as the laser diode or the carbon dioxide laser oscillator. Accordingly, in order to stabilize the laser oscillation in a high-power laser device, for example, a cooler is provided, which uses a water coolant to cool the laser source.

Such laser sources are housed in a housing with an airtight structure and in order to perform maintenance or repairs on the laser source, a door or a removable wall panel is provided on the housing. When such a door or wall panel is opened or removed, air of a comparatively high humidity contacts a portion to be cooled of the laser source which has been cooled by the water coolant to a low temperature, and condensation forms on the portion to be cooled.

In the case a driving voltage is applied to the laser source, if water droplets due to condensation form on the laser source, the laser source or peripheral components thereof will be damaged. For example, in a semiconductor laser device, if a water droplet is adhered to the laser diode to which a driving voltage is applied, the electrodes of the laser diode could be easily short-circuited and the laser diode could be irreparably damaged. Further, in a carbon dioxide laser device, if a water droplet is adhered to the electrodes to which a high voltage is applied to excite the carbon dioxide gas, a spark may be generated and the electrodes or components in the periphery of the electrodes may be damaged.

Further, even when a driving voltage is not applied to a laser source, if a water droplet is adhered to the laser source and components in the periphery thereof as a result of condensation in the laser device, the contamination and corrosion resulting therefrom may result in a large decrease in reliability of the components. Further, if a water droplet is adhered to a laser source in a laser device or the electrodes of a laser source, when the laser device is restarted, as described above, an electric short or a spark may be generated causing damage to the laser source or components in the periphery thereof.

Conventionally, in the case it is necessary to open a door or a wall panel of a laser device which has been operated for maintenance or repairs, after the operation of the laser device is stopped, the following measures are taken to prevent condensation forming in the laser device.

Namely, in response to the operation of the laser device being stopped, the supply of water coolant to the laser source (hereinafter referred to as the cooling operation) is stopped. Accordingly, the temperature of the portion to be cooled of the laser source, which has been cooled to a low temperature by water coolant, increases. The door or a wall panel is opened or removed after the temperature of the portion to be cooled increases to a temperature near room temperature. At this time, to ensure that condensation does not form on the laser device by opening or removing the door or the wall panel of the laser device too early, the door or wall panel is opened or removed after the cooling operation is stopped and a sufficiently long time is taken.

Further, Japanese Patent Application laid-open No. 2007-193857, Japanese Patent No. 4085649 and Japanese Examined Patent Publication H06-32336 disclose a technology which prevents the formation of condensation based on the detection of the temperature and the humidity around the device.

However, in such prior art, when maintenance or repairs need to be carried out inside the laser device, it is impossible to know how long it will take from when the operation of the laser device has been stopped to when the door or the wall panel of the laser device can be opened.

Further, as the temperature of the portion to be cooled of the laser source is not measured, it is impossible to know whether or not the temperature of the portion to be cooled is such that condensation will not form thereon when the door or the wall panel of the laser device is opened. Therefore, there are cases when the waiting time taken from stopping the operation of the laser device to the start of maintenance or repairs is longer than necessary. Namely, in the prior art, there was the problem that maintenance or repairs cannot be completed in a short amount of time after the operation of the laser device has been stopped.

Further, as the appropriate amount time with respect to the waiting time as described above cannot be known, there are cases where the door or the wall panel of the laser device is opened too early after the laser device is stopped. In such cases, condensation forms on the portion to be cooled of the laser source.

Accordingly, as described above, problems such as contamination or corrosion of the laser source and components in the periphery thereof due to water droplets may occur, or when a voltage is again applied to the laser source, the laser source and peripheral components may be damaged. Further, even if it is understood that such problems may occur, there is a risk that the door or wall panel of the laser device is opened early by mistake.

SUMMARY OF INVENTION

The present invention provides a laser device wherein a door or wall panel of the laser device may be opened at an appropriate time such that condensation does not form in the laser device when maintenance or repairs are carried out in the laser device.

According to the first aspect of the present invention there is provided a laser device comprising: a cooler; a portion to be cooled by the cooler including a laser source; and a housing which has an airtight structure housing at least the cooler and the portion to be cooled, wherein the walls of the housing are configured to be openable by a door or a wall panel wherein the laser device comprising: a first temperature sensor which is provided in the housing to detect the temperature of the portion to be cooled; a second temperature sensor and a humidity sensor which are provided outside the housing to respectively detect the temperature and humidity of the air outside the housing; and a judgment unit which calculates the dew point of the air outside the housing based on the temperature of the air outside the housing detected by the second temperature sensor and the humidity of the air outside the housing detected by the humidity sensor, and judges the possibility of whether or not condensation will form on the portion to be cooled due to the air outside the housing, by comparing the temperature of the portion to be cooled detected by the first temperature sensor with the calculated dew point.

According to the second aspect of the present invention there is provided the laser device according to the first aspect further comprising: a detector which detects the act of opening at least one of the door and the wall panel; and a notification unit which notifies the outside of the housing of the judgment result of the judgment unit; wherein when the judgment unit has judged that there is a possibility of condensation forming on the portion to be cooled, and the detector has detected the aforementioned act, the notification unit is configured to give notification that when the door or a wall panel is opened, condensation will form on the portion to be cooled.

According to the third aspect of the present invention, there is provided the laser device of the first or second aspect further comprising a locking device which locks the door and the wall panel while the judgment unit judges that there is a possibility of condensation forming on the portion to be cooled.

According to the fourth aspect of the present invention, there is provided the laser device according to the third aspect further comprising an emergency release switch which releases the lock on the door and the wall panel which are locked by the locking device, regardless of the judgment of the judgment unit.

According to the fifth aspect of the present invention there is provided the laser device according to any one of the first to fourth aspects further comprising: a calculation unit which calculates the time needed for the temperature of the portion to be cooled to reach a temperature where there is no possibility of condensation forming on the portion to be cooled by stopping the operation of the cooler when the judgment unit judges there is a possibility of condensation forming on the portion to be cooled; and a notification unit which notifies the outside of the housing of the judgment result of the judgment unit, wherein the notification unit displays the time calculated by the calculation unit as the time taken till the door or the wall panel can be opened.

According to the sixth aspect of the present invention there is provided the laser device according to any one of the first to fifth aspects further comprising a heater which heats the portion to be cooled when the judgment unit judges there is a possibility of condensation forming on the portion to be cooled.

According to the seventh aspect of the present invention there is provided the laser device according to the first aspect further comprising an operation unit which includes a judgment switch which starts a process of judging whether or not there is a possibility of condensation forming on the portion to be cooled if the door or the wall panel is opened; a notification unit which notifies the outside of the housing of the judgment result of the judgment unit; a locking device which locks the door and the wall panel; a calculation unit which calculates the time needed for the portion to be cooled to reach a temperature where it will be judged that there is no possibility of condensation forming on the portion to be cooled after stopping the operation of the cooler; a heater which heats the portion to be cooled; and a controller which controls at least the cooler, the notification unit, the locking device and the heater, wherein the controller, according to the input of the judgment switch, stops the operation of the cooler, and when the judgment unit judges there is a possibility of condensation forming on the portion to be cooled, the controller instructs the notification unit to give notification that opening the door or the wall panel will generate condensation on the portion to be cooled, instructs the locking device to lock the door and the wall panel, instructs the heater to heat the portion to be cooled, and instructs the notification unit to display the time calculated by the calculation unit, whereas, when the judgment unit judges there is no possibility of condensation forming in the portion to be cooled, the controller instructs the heater to stop the heating operation, instructs the locking device to release the lock, and instructs the notification unit to give notification that the door or the wall panel may be opened.

According to the eighth aspect of the present invention there is provided the laser device according to any one of the first to seventh aspects, wherein: the notification unit, comprises at least one of a display unit which displays the judgment result of the judgment unit and an alarm unit which emits a warning of at least one of light and sound corresponding to the judgment result of the judgment unit; the display unit displays a warning that condensation will form on the portion to be cooled if the door or wall panel is opened or removed when the judgment unit judges that there is a possibility of condensation forming on the portion to be cooled; and the alarm unit emits a warning of at least one of light and sound that condensation will form on the portion to be cooled if the door or the wall panel is opened, when the judgment unit determines that there is a possibility of condensation forming on the portion to be cooled.

According to the ninth aspect of the present invention there is provided the laser device according to the eighth aspect, wherein: the display unit, when the judgment unit determines that there is no possibility of condensation forming on the portion to be cooled, displays that the door or the wall panel may be opened; and the alarm unit emits at least one of a sound and light different from those emitted when the judgment unit determines that there is a possibility of condensation forming on the portion to be cooled, to notify of that the door or the wall panel may be opened when the judgment unit determines that there is no possibility of condensation forming on the portion to be cooled.

BRIEF DESCRIPTION OF DRAWINGS

The above mentioned objects, features, and advantages and other objects, features and advantages of the present invention will become more apparent from the following detailed description of the exemplary embodiments of the present invention illustrated in the accompanying drawings in which.

DETAILED DESCRIPTION

Figure 1:
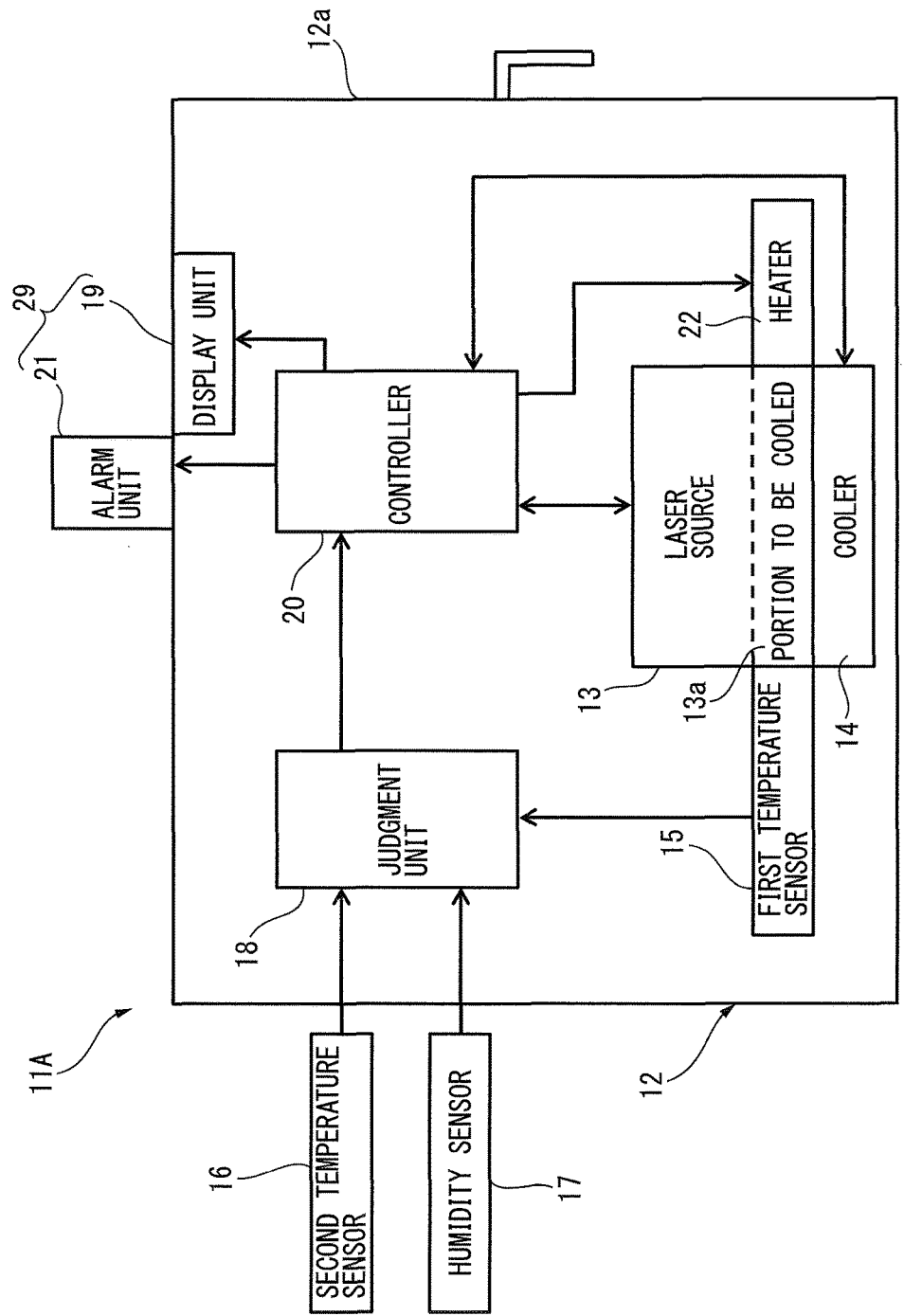
FIG. 1 is a block diagram illustrating the configuration of a laser device of the first embodiment.

Hereinafter, embodiments of the present invention will be described referring to the drawings. The same reference numerals for the same or corresponding constitutional elements are used over the drawings. The scale of the drawings showing the constitutional elements of the illustrated embodiments has appropriately been adjusted so as to facilitate the understanding of the present inventions. Further, the following explanation of the laser device is exemplified mainly by the application thereof to sheet metal cutting or a laser welding machine. However, the present inventions are not limited thereto.

(First Embodiment)

FIG. 1 is a block diagram illustrating the configuration of the laser device of the first embodiment.

As illustrated in FIG. 1, the laser device 11A of the first embodiment comprises a housing 12 which has a sealed structure formed from a plurality of walls, and a laser source 13 housed in the housing 12. Further, one of the plurality of walls has an openable/closable door 12a, and the other walls are made of detachable wall panels. In the laser device 11A, however, when the wall panels are attached and the door 12a is closed, the interior of the housing 12 is sealed with respect to the outside.

Further, provided in the housing 12 with a sealed structure is a power source (not shown) which drives the laser source 13, and a cooler 14 which cools the heat generated from heat generating components such as the power source and the laser source 13, etc.

The laser source 13 is, for example, a laser diode, a carbon dioxide laser, and the like.

Furthermore, a representative example of the cooler 14 is a water cooler which cools heat generating parts by cooling water which is introduced from outside the housing 12 of the laser device 11A. Such a water cooler includes, for example, a cooler having a heat exchanger to which cooling water adjusted to a low temperature by a chiller is supplied, with cold water circulating between the heat exchanger and the chiller. By abutting the heat generating component with the heat exchanger, the cooling water in the heat exchanger removes the heat from the heat generating part. Further, the cooling water which has increased in temperature is adjusted to a low temperature by the chiller and flows back to the heat exchanger, thereby allowing the suppression of a temperature rise in heat generating components such as the laser source 13. Of course, the cooler used in the present invention is not limited to a water cooler, and a circulation type cooler with a compressor, an electronic cooler which uses a Peltier element, or the like may be used.

Furthermore, as shown in FIG. 1, a first temperature sensor 15 is provided in the housing 12. The first temperature sensor 15 detects the temperature of a portion (namely the portion to be cooled 13a) of heat generating components, such as the laser source 13 and the power source which drives the same, which is cooled to a low temperature by the cooler 14. On the other hand, a second temperature sensor 16 which detects the temperature of the external air of the housing 12 and a humidity sensor 17 which detects the humidity of the external air of the housing 12 are provided outside the housing 12. Note that in FIG. 1 there is one first temperature sensor 15, one second temperature sensor 16 and one humidity sensor 17. However, the number of each of the sensors 15, 16 and 17 need not be limited to one.

Further, a judgment unit 18 is provided in the housing 12 of the laser device 11A. The judgment unit 18 judges whether or not there is a possibility of condensation forming on the portion to be cooled 13a when the door 12a or the wall panel of the laser device 11A is opened. Namely, the judgment unit 18 judges whether or not condensation will form on the portion to be cooled 13a by air (outside air) coming into the housing 12 from the outside by the opening of the door 12a or the wall panels.

To that end, the judgment unit 18 calculates the dew point of the air outside the laser device 11A (outside air dew point) based on the temperature of the air outside the housing 12 (outside temperature) detected by the second temperature sensor 16 and the humidity (relative humidity) of the air outside the housing 12 detected by the humidity sensor 17. Further, the judgment unit 18 compares the calculated dew point with the temperature of the portion to be cooled 13a detected by the first temperature sensor 15 and judges whether or not there is a possibility of condensation forming on the portion to be cooled 13a due to the outside air as described above.

Figure 2:
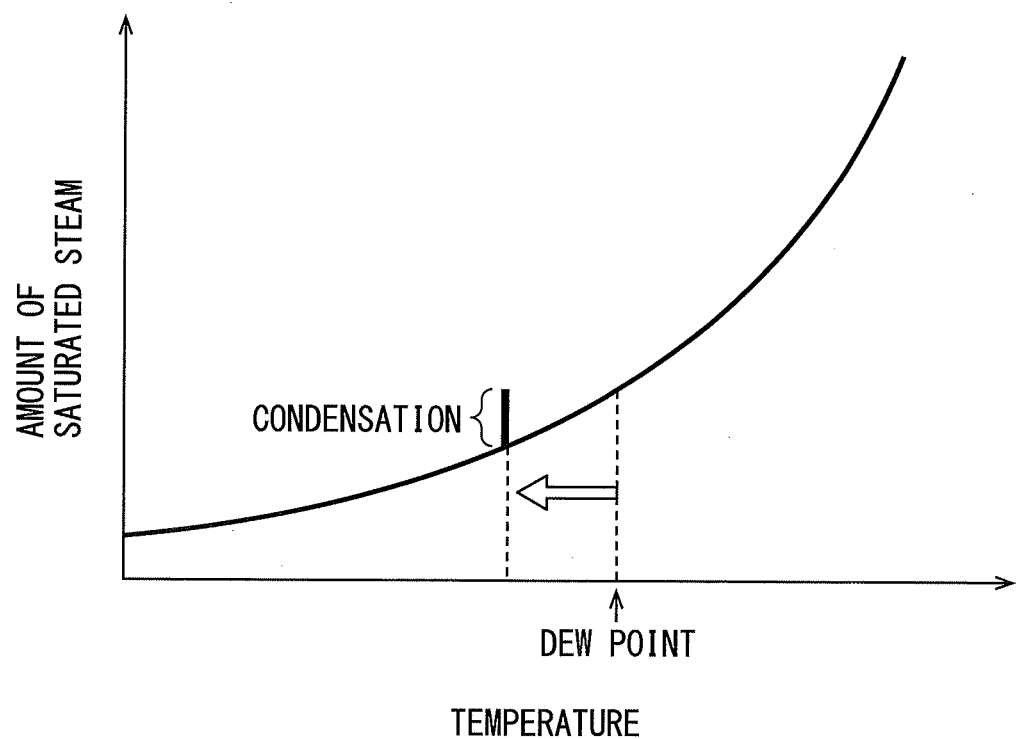
FIG. 2 is a graph illustrating the relation between temperature and the amount of saturated water vapor.

FIG. 2 is a graph showing the relation between the temperature and the amount of saturated steam. As illustrated in FIG. 2, the higher the temperature, the higher the amount of saturated steam included in the air. Accordingly, if the temperature goes below the dew point, steam in excess of the saturated steam included in the air (thick line in FIG. 2) becomes water (condensation). In the present invention, when the temperature of the portion to be cooled 13a is lower than the dew point of the outside air, the outside air which contacts the portion to be cooled 13a will be cooled to below the dew point of the outside air, and water vapor included in the outside air will form droplets of water on the portion to be cooled 13a. Therefore, as described above, if the dew point of the outside air, and the temperature of the portion to be cooled 13a are compared, the possibility of whether or not condensation will form on the portion to be cooled 13a can be known. Further, in such comparisons, it is desirable to make the comparison while taking into account a margin of error for the dew point of the outside air, thus an allowable error is added to a predetermined temperature range of dew points to be compared with the temperature of the portion to be cooled 13a. Furthermore, regarding the method for calculating the dew point, for example, it is possible to use the JIS table of saturated water vapor pressure or a psychrometric chart for an approximate calculation.

Further, the judgment result as described above is sent to the controller 20, which is configured to control the display of the display unit 19 corresponding to the judgment result. The display unit 19 is provided on the wall of the housing 12. Note that the controller 20 also controls the operation of the laser source 13 and the cooler 14. Furthermore, when the judgment unit 18 judges that there is a possibility of condensation forming on the portion to be cooled 13a, the controller 20 instructs the display unit 19 to display a warning that condensation will form on the portion to be cooled 13a if the door 12a or the wall panel is opened.

Further, in the present embodiment, an alarm unit 21 is provided outside the housing 12, the judgment result of the judgment unit 18 may be notified thereby. Namely, when judgment unit 18 judges that there is a possibility of condensation forming on the portion to be cooled 13a, it is preferable for the controller to instruct the alarm unit 21 to emit a warning that condensation will form on the portion to be cooled 13a if the door 12a or the wall panel is opened. As a means for warning of condensation forming on the portion to be cooled 13a, at least one of a sound or light may be used. Further, as shown in FIG. 1 the alarm unit 21 may be provided separately from the display unit 19 or may be used as an alternative means to the display unit 19.

Namely, in the present application, is at least one of the display unit 19 on which the judgment result of the judgment unit 18 is displayed and the alarm unit 21 which emits a warning of at least one of a sound and light corresponding to the judgment result of the judgment unit 18 may be used as a notification unit 29 which notifies the outside of housing 12 of the judgment result of the judgment unit 18.

According to the first embodiment described above, when maintenance or repairs are carried out inside the laser device 11A, it is possible to easily and accurately confirm whether condensation will form on the portion to be cooled 13a when the door 12a or the wall panel of the laser device 11A is opened. Namely, after stopping the operation of the laser source 13 and the cooler 14 for maintenance or repairs, the time the door 12a or wall panel of the laser device 11A can be opened can be understood precisely. Accordingly, the waiting time required to start maintenance or repairs from when the operation of the laser source 13 and the cooler has been stopped can be minimized. Further, wasted time for waiting is reduced, and emergency repairs can be quickly started.

Further, according to the first embodiment described above, due to the display unit 19 or the alarm unit 21, a person carrying out maintenance or repair is less likely to open the door 12a or the wall panels of the laser device 11a too quickly by mistake. Accordingly, damage to the laser source 13 or peripheral components in the housing due to the formation of condensation thereon as a result of the door 12a or the wall panels being opened too quickly can be prevented.

Note that, in the embodiment indicated in FIG. 1, the portion to be cooled 13a of the laser device 11A is indicated as a portion of the laser source 13, i.e. the laser diode or the carbon dioxide laser etc. cooled by the cooler 14. However, in the present invention, the portion to be cooled 13a is not limited to one portion of the laser source 13 but includes the laser source 13 and peripheral components thereof. For example, if the power source that drives the laser source 13 (not illustrated) is cooled, the power source is also included as the portion to be cooled 13a. In such cases, a first temperature sensor 15 may be added in the housing 12 to detect the temperature of the power source. Further, information of the detected temperature of the power source is sent to the judgment unit 18 and the judgment unit 18 judges whether or not there is a possibility of condensation forming on the power source.

Further, it is preferable that the laser device 11A of the first embodiment as described above be provided with a heater 22 which heats the portion to be cooled 13a. By the heater 22 warming the portion to be cooled 13a, the temperature of the portion to be cooled 13a can be quickly raised to a temperature where condensation will not form thereon. Accordingly, the waiting time from when the operation of the laser source 13 and the cooler have been stopped to when maintenance or repairs can be started is reduced.

The heater 22 may be arranged in the portion to be cooled 13a or outside the portion to be cooled 13a. Further, in a laser device 11A in which a laser diode is used as the laser source 13, the temperature of the portion to be cooled 13a may be raised by supplying a current smaller than the oscillation threshold current to the laser diode. In the case the laser device 11A uses a water cooler as the cooler 14, the temperature of the portion to be cooled 13a may be raised by the flow of warm water instead of cold water through the water cooler.

However, the second temperature sensor 16 and the humidity sensor 17 are only necessary to determine whether or not it is acceptable to open the door 12a or the wall panel of the laser device 11A for maintenance or repairs, thereby allowing the outside air in. In order to suppress costs, only an interface such as a connector which can input the output of each of the second temperature sensor 16 and the humidity sensor 17 is provided, and when it is necessary to allow the outside air in, the interface may be connected to the second temperature sensor 16 and the humidity sensor 17 so that the output of each of the second temperature sensor 16 and the humidity sensor 17 may be input to the laser device 11A. Namely, it is only necessary to fully equip the constitutional elements of the present embodiment by connecting the second temperature sensor 16 and the humidity sensor 17 to the laser device 11A when it is necessary to allow the outside air in.

In such a case, when the second temperature sensor 16 and the humidity sensor 17 are not connected to the laser device 11A, the judgment unit 18 may make a judgment which is the same as when there is a possibility of condensation forming on the entry of the outside air. Further, the fact that the second temperature sensor 16 and the humidity sensor 17 are not connected, or a request urging the connection of the second temperature sensor 16 and the humidity sensor 17 may be displayed on the display unit 19.

(Second Embodiment)

Next, the second embodiment will be described. Note that structural elements which are the same as those in the first embodiment will have the same reference numerals and only points different to the first embodiment will be described.

Figure 3:
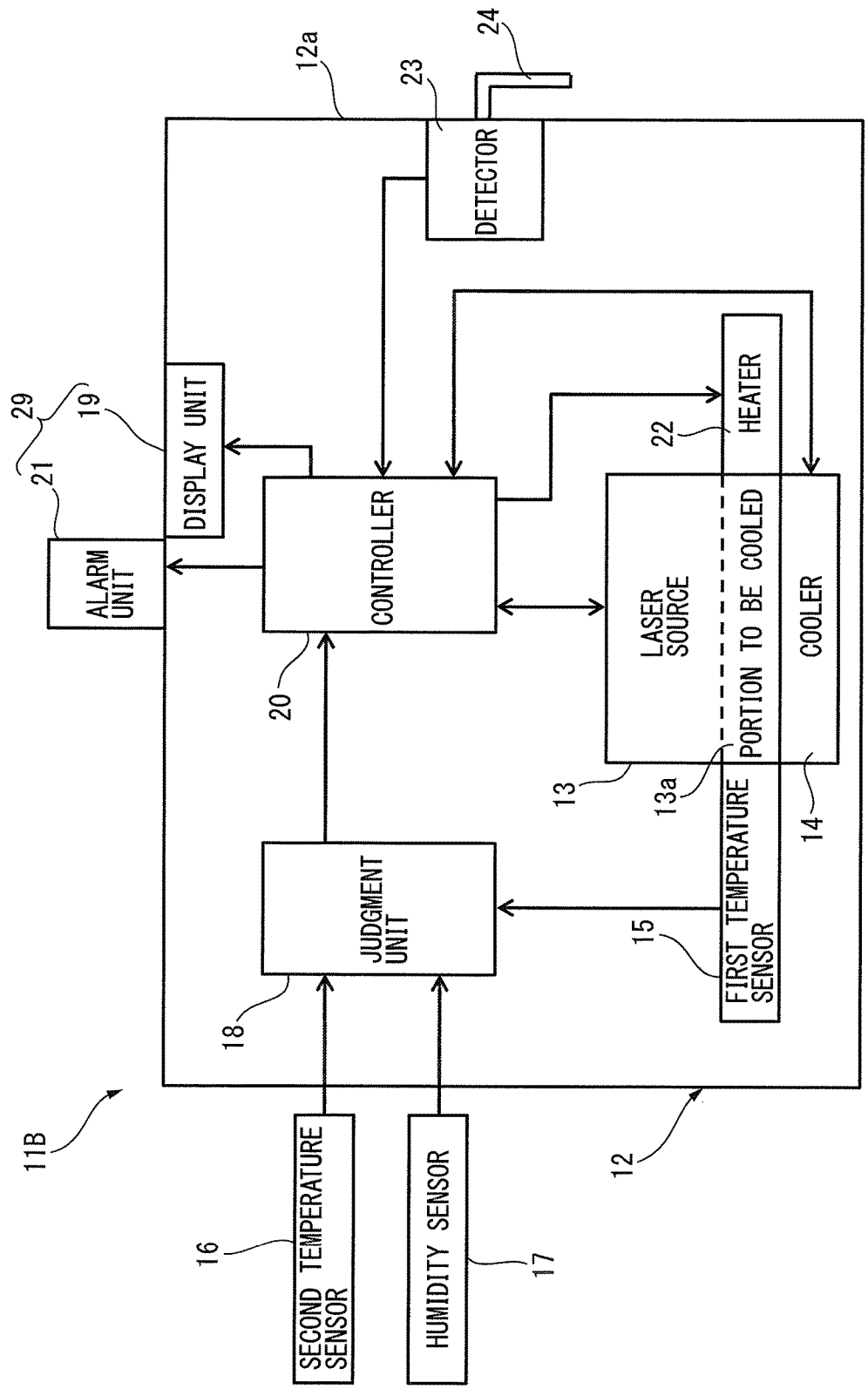
FIG. 3 is a block diagram illustrating the configuration of a laser device of the second embodiment.

FIG. 3 is a block diagram illustrating the configuration of the laser device of the second embodiment.

As illustrated in FIG. 3, the laser device 11B of the second embodiment is the first embodiment of the laser device 11A (refer to FIG. 1) further comprising a detector 23 which detects the opening of the door 12a or the wall panel of the laser device 11B. For example, the detector 23 may detect the rotation of a handle 24 or a knob which is adapted to open the door 12a, or may detect the loosening of screws when a wall panel of the housing 12 is removed.

Further, if the judgment unit 18 judges there is a possibility of condensation forming on the portion to be cooled 13a and the detector 23 detects the operation of the handle 24 or knob, the controller 20 instructs the display Unit 19 to display a warning that condensation will form on the portion to be cooled 13a when the door 12a is opened. Furthermore, when such an operation of the handle 24 or the knob is detected, the controller 20 instructs the alarm unit 21 to emit a warning of at least one of a sound and light. Namely, regardless of whether a warning message is displayed on the display unit 19, if an operation to open the door 12a or a wall panel of the laser device 11B occurs, the alarm unit 21 emits at least one of a sound and light.

Therefore, the second embodiment ensures the prevention of a person opening the door 12a or a wall panel of the laser device 11B to carry out maintenance or repairs without realizing that a warning is displayed. Further, according to the configuration of how the handle 24 or the knob to open the door 12a is detected to emit a sound or light warning, notification of the possibility of condensation forming on the portion to be cooled 13a can be carried out with good timing and at a low cost.

(Third Embodiment)

Next, the third embodiment will be described. Note that the structural elements which are the same as those in the first and second embodiments will have the same reference numerals and a description therefor will be omitted. Only points different to the first and second embodiments will be described.

Figure 4:
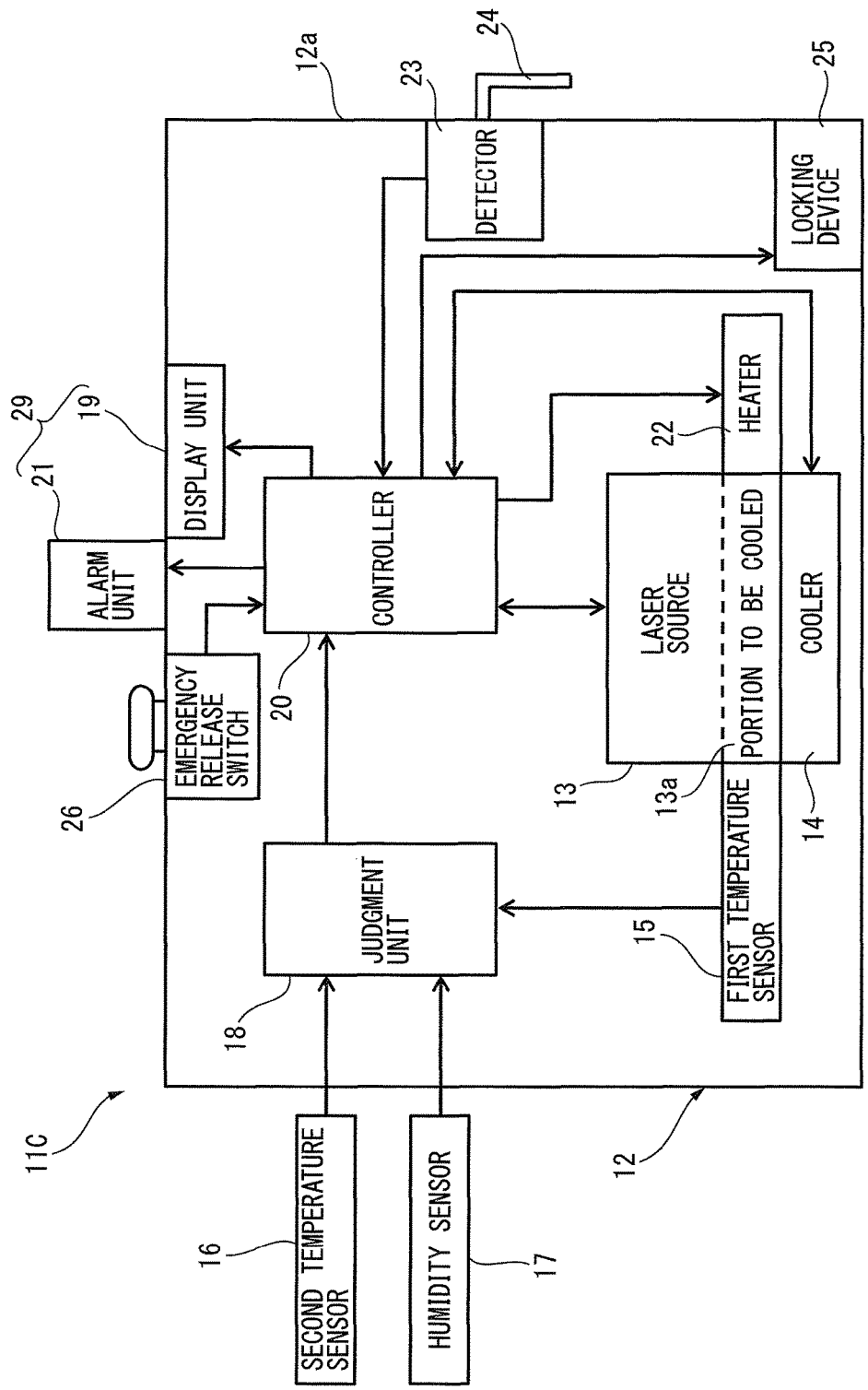
FIG. 4 is a block diagram illustrating the configuration of the laser device of the third embodiment.

FIG. 4 is a block diagram illustrating the configuration of the laser device of the third embodiment.

As illustrated in FIG. 4, the laser device 11C of the third embodiment is the second embodiment of the laser device 11B (refer to FIG. 3) further comprising a locking device 25 for locking the door 12a or the wall panels of the laser device 11C. The locking device 25 performs locking and unlocking electrically. Further, while the judgment unit 18 judges that there is a possibility of condensation forming on the portion to be cooled 13a, the controller 20 1 instructs the locking device 25 to lock the door 12a and the wall panels of the laser device 11. By providing such a locking device 25, the door 12a and the wall panels of the laser device 11C cannot be opened if there is a possibility of condensation forming on the portion to be cooled 13a.

Therefore, the third embodiment ensures that a person carrying out maintenance or repairs is prevented from carelessly opening the door 12a or a wall panel of the laser device 11C despite a warning message displayed on the display unit 19 or a warning sound etc. from the alarm unit 21, resulting in the formation of condensation on the portion to be cooled 13a.

Furthermore, it is preferable for the laser device 11C according to the third embodiment, to be provided with an emergency release switch 26 which unlocks the door 12a and the wall panels regardless of the judgment result of the judgment unit 18. Further, when the door 12a or the wall panels of the laser device 11C are locked by the locking device 25, on inputting the emergency release switch 26, the controller 20 unlocks the door 12a and the wall panels locked by the locking device 25. The provision of such an emergency release switch 26 allows for an appropriate response in an emergency, for example, the occurrence of a water leakage or fire in the laser device 11C, namely in emergency situations where opening the door 12a or the wall panels of the laser device 11C takes priority over preventing damage to the components inside the laser device 11C due to condensation. In such cases, by pressing the emergency release switch 26, it is possible to immediately open the door 12a and the wall panels of the laser device 11C.

Note that, in the aforementioned third embodiment, it is not necessary to provide a detector 23 to detect the movement of the handle 24 to open the door 12a or the wall panels.

(Fourth Embodiment)

Next, the fourth embodiment will be described. Note that the structural elements which are the same as those in the first to third embodiments will have the same reference numerals and a description therefor will be omitted. Only points different to the first to third embodiments will be described.

Figure 5:
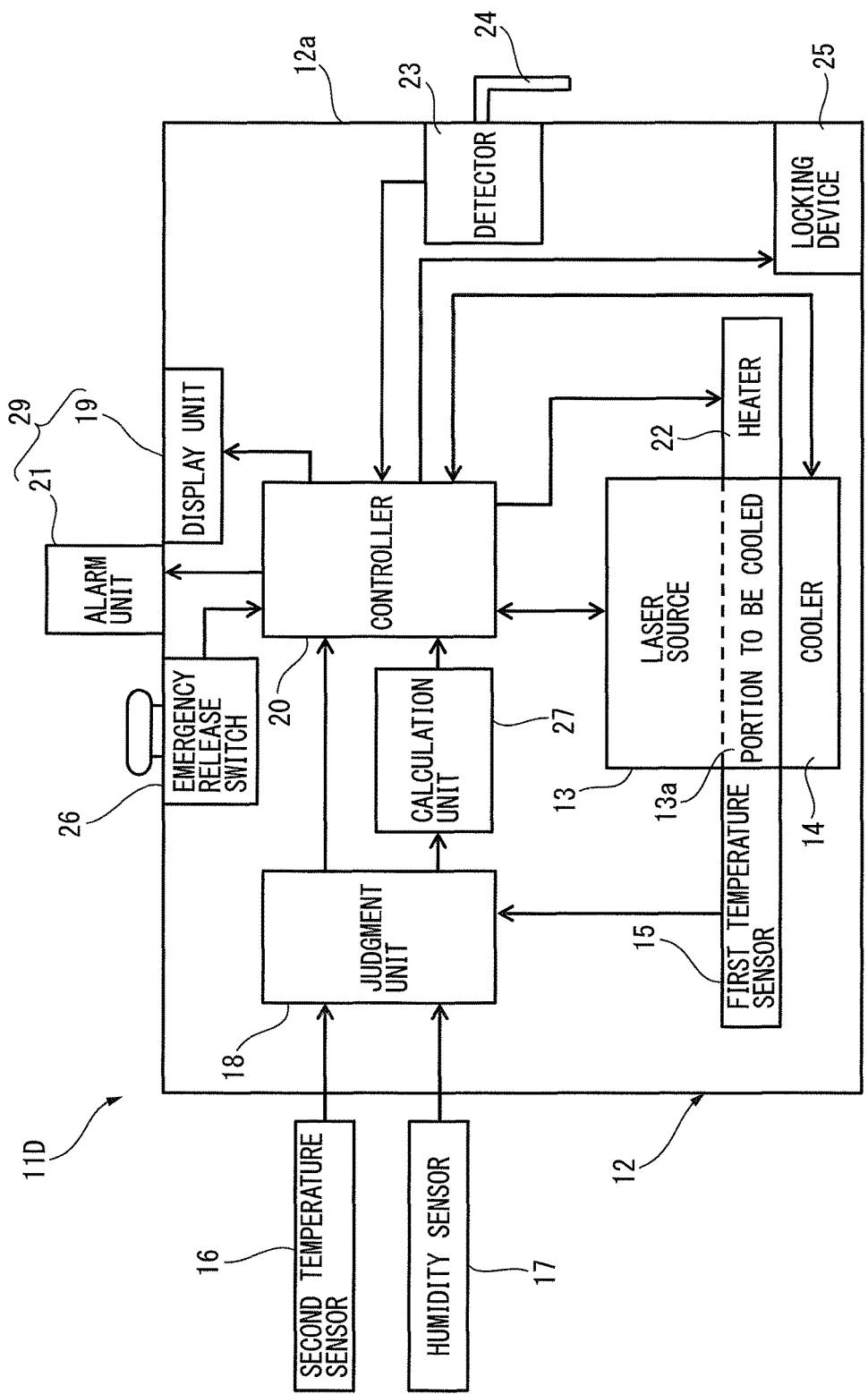
FIG. 5 is a block diagram illustrating the configuration of the laser device of the fourth embodiment.

FIG. 5 is a block diagram illustrating the configuration of the laser device according to the fourth embodiment.

As illustrated in FIG. 5, the laser device 11D of the fourth embodiment is the laser device 11C of third embodiment further comprising a calculation unit 27 which calculates the waiting time from when the operation of the laser source 13 and the cooler 14 are stopped to when it is feasible for the door 12a and the wall panels to be opened. Further, the calculation unit 27 calculates the waiting time when the judgment portion 18 judges that there is a possibility of condensation forming on the portion to be cooled 13a.

The waiting time corresponds to the time required for the temperature of the portion to be cooled 13a to reach a temperature at which it is judged that there is no possibility of condensation forming on the portion to be cooled 13a. In other words, the time taken for the temperature of the portion to be cooled 13a to become higher than the dew point calculated by the judgment unit 18 corresponds to the waiting time. Accordingly, if the rate of change of temperature of the portion to be cooled 13a is known, the waiting time can be estimated and the waiting time can be calculated by, for example, the following method. First, using the first temperature sensor 15, the temperature change of the portion to be cooled 13a from when the operation of the laser source 13 and the cooler 14 are stopped to a predetermined time thereafter is sought, to obtain the rate of change of temperature of the portion to be cooled 13a over time. Then, from the dew point value calculated by the judgment unit 18, the temperature value of the portion to be cooled 13a when the operation of the laser source 13 and the cooler 14 are stopped, is subtracted. Then, the value of the difference is divided by the rate of change of temperature of the portion to be cooled 13a over time, and therefore, the aforementioned waiting time can be calculated.

Next, the controller 20 instructs the display unit 19 to display the calculated waiting time as the waiting time from when the operation of the laser source 13 and the cooler 14 was stopped to when it is possible to open the door 12a or the wall panels. It is preferable for such a waiting time to be displayed as a countdown.

In the fourth embodiment, as the waiting time is known, the time can be effectively used to do other work. Accordingly, it is easier to set up a work plan, and efficient work can be carried out. Further, if emergency repairs need to be carried out, as the waiting time till the repairs can be carried out is known, irritation resulting therefrom can be reduced.

It is preferable for the laser device 11A and the laser device 11B of the first and second embodiment respectively to be provided with the calculation unit 27 and the display function accompanying it, as described above.

Further, in the laser devices 11A to 11D of the first to fourth embodiments as described above, it is preferable that the controller 20 instructs the display unit 19 to display that the door 12a or the panels of the laser device may be opened when the judgment unit 18 judges there is no possibility of condensation forming on the portion to be cooled 13a. In such cases, when the judgment unit 18 has judged there is no possibility of condensation forming, the controller 20 may operate the alarm unit 21 so as to give notification by, for example, a sound or light, that the door 12a or the wall panels of the laser device can be opened. It is preferable that the tone of the sound or the color of the light used for giving notification of the fact that door 12a and the wall panels of the laser device can be opened should greatly differ from the sound and light used when issuing a warning. By providing such a function, it is easy to understand at a separate location that the door 12a or the walls panels of the laser device can be opened. Thus there is no need for a person carrying out maintenance or repairs to wait longer than is necessary and the maintenance and repairs can be started after the door 12a and the panels are opened. Namely, wasted waiting time can be reduced and emergency repairs can be started early.

Furthermore, a function of wirelessly sending to a portable information terminal, a command signal from the controller 20 to display on the display unit 19 that the door 12a or the wall panels of the laser device may be opened or to emit a sound or light from the alarm unit 21, may be provided. By providing such a function, it is possible to recognize that the door 12a or the wall panels of the laser device may be opened, even when the laser device cannot be seen directly.

(Fifth Embodiment)

Next, the fifth embodiment will be explained. Note that the structural elements which are the same as those in the first to fourth embodiments will have the same reference numerals and a description therefor will be omitted. Only points different to the first to fourth embodiments will be described.

Figure 6:
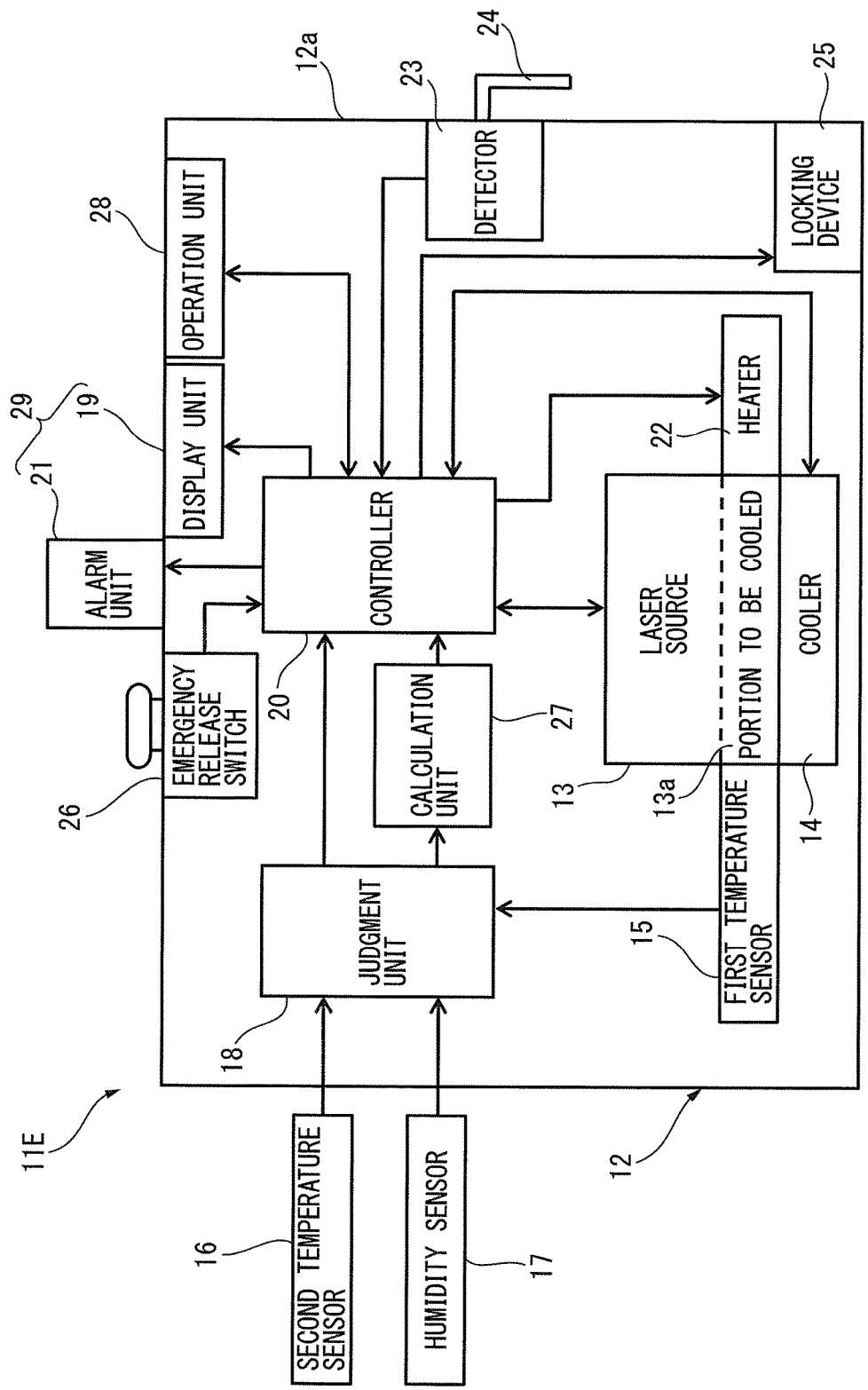
FIG. 6 is a block diagram illustrating the configuration of the laser device of the fifth embodiment.

FIG. 6 is a block diagram illustrating the configuration of the laser device according to the fifth embodiment.

As illustrated in FIG. 6, the laser device 11E of the fifth embodiment is the laser device 11D (refer to FIG. 5) of the fourth embodiment further comprising an operation unit 28. The operation unit 28 includes a judgment switch (not illustrated) which, at a time when opening the door 12a or the wall panels of the laser device is desired, starts the judgment of whether there is a possibility of condensation forming on the portion to be cooled 13a in the laser device if the door 12a or the wall panels are opened. The operation unit 28 sends the on signal of the judgment switch to the controller 20, and the control 20 in response to the on signal of the judgment switch carries out the following processing sequence (refer to FIG. 7).

Figure 7:
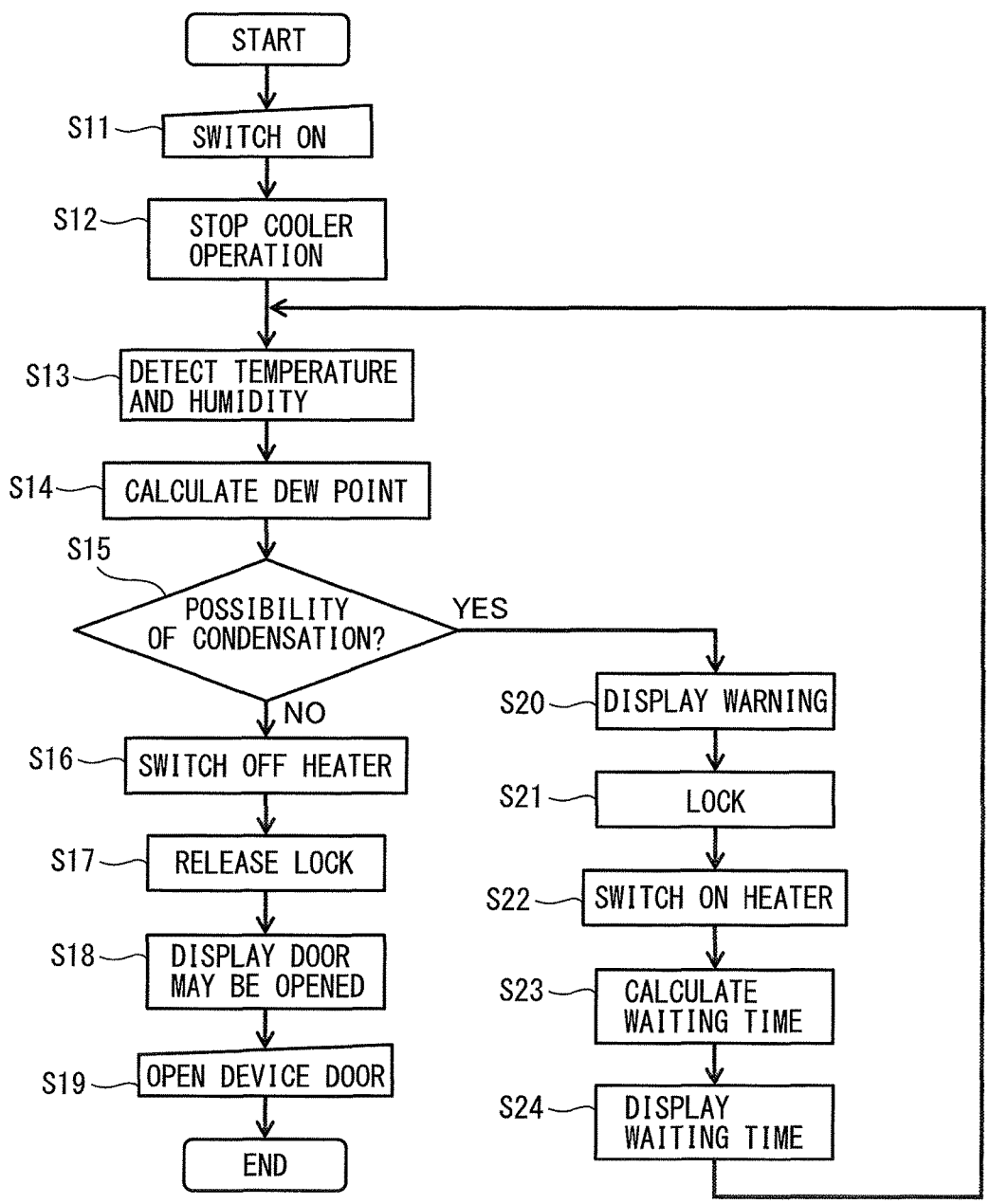
FIG. 7 is a flowchart illustrating the processing sequence when turning on the judgment switch of the operation unit of the laser device illustrated in FIG. 6.

FIG. 7 is a flowchart illustrating the processing sequence on switching on the judgment switch of the operation unit 28 of the laser device 11E. Note that, in FIG. 7, a processing sequence after the stoppage of the operation of the laser device 11E which has been operated in a state where the housing 12 is sealed is indicated.

With reference to both FIG. 6 and FIG. 7, first, when a person inputs the judgment switch (not illustrated) in the operation unit 28, the controller 20 stops the operation of the cooler 14 which cools the portion to be cooled 13a (step S11 and S12 in FIG. 7). Accordingly the judgment unit 18 detects the temperature of the portion to be cooled 13a by the first temperature sensor 15 and detects the temperature and the humidity of the air outside the housing 12 by the second temperature sensor 16 and the humidity sensor 17 respectively (step S13 in FIG. 7).

Furthermore, the judgment unit 18 calculates the dew point of the air outside the housing 12 from the temperature and humidity of the air outside the housing 12 detected by the second temperature sensor 16 and the humidity sensor 17 (step S14 in FIG. 7). Then, the judgment unit 18 compares the calculated dew point with the temperature of the portion to be cooled 13a detected by the first temperature sensor 15 and judges whether or not there is the possibility that condensation will form on the portion to be cooled 13a in the laser device 11E if the door 12a or a wall panel of the laser device is opened (step S15 in FIG. 7). The judgment method is the same method as described in the first embodiment.

In step S15 in FIG. 7, if it is determined that there is no possibility of condensation forming on the portion to be cooled 13a in the laser device 11E, the controller 20 does not instruct the heater 22 to heat the portion to be cooled 13a, and instructs the locking device 25 to release the lock on the door 12a and the wall panels (step S16 and S17 in FIG. 7). Then the controller 20 instructs the display unit to display that the door 12a and the wall panels of the laser device 11E may be opened (step S18 in FIG. 7). In this situation, the controller 20 may activate the alarm unit 21 to give notification by, for example, a sound or light, that the door 12a or the wall panels may be opened. Thereafter, when the detector 23 detects that the door 12a or a wall panel has been opened (step S19 in FIG. 7), the controller 20 stops the alarm unit 21 and the processing sequence ends.

On the other hand, in step S15 in FIG. 7, when it is judged that there is a possibility of condensation forming on the portion to be cooled 13a in the laser device 11F, the controller 20 instructs the display unit 19 to display a warning that condensation will form on the portion to be cooled 13a in the laser device 11E if the door 12a or the wall panels of the laser device 11E are opened (step S20 in FIG. 7). In such cases, the controller 20 may activate the alarm unit 21 so as to give notification by, for example, a sound or light, that condensation will form on the portion to be cooled 13a if the door 12a or a wall panel of the laser device 11E is opened.

Furthermore, depending on the judgment result of the possibility of condensation forming on the portion to be cooled 13a, the controller 20 instructs the locking device 25 to lock the door 12a and the wall panels of the laser device 11E (step S21 in FIG. 7). Then the controller 20, in order to hasten the temperature rise of the portion to be cooled 13a, instructs the heater 22 to heat the portion to be cooled 13a (step S22 in FIG. 7).

Next, the calculation unit 27 calculates the waiting time from when the operation of the laser source 13 and the cooler were stopped to when maintenance or repairs can be started (step S23 in FIG. 7). In other words, the calculation unit 27 calculates as the aforementioned waiting time, the time for the temperature of the portion to be cooled 13a to become higher than the dew point calculated by the judgment unit 18 after the operation of the cooler 14 has been stopped. Next, the controller 20 instructs the display unit 19 to display the waiting time calculated by the calculation unit 27 (step S24 in FIG. 7).

After the above step S24, steps S13 to S24 are repeated until it is judged that there is no possibility of condensation forming on the portion to be cooled 13a. Then, in step S15, when it is judged that there is no possibility of condensation forming on the portion to be cooled 13a, the controller 20 instructs the heater 22 to stop heating the portion to be cooled, and instructs the locking device 25 to unlock the locks on the door 12a and the wall panels of the laser device 25 (step S16 and S17 in FIG. 7).

Thereafter, the controller 20 instructs the display unit 19 to display that the door 12a or the wall panels of the laser device 11E may be opened (step S18 in FIG. 7). Furthermore the controller 20 activates the alarm unit 21 so as to give notification by, for example, a sound or light, that the door 12a or the wall panels of the laser device may be opened. Then, when the detector 23 detects that the door 12a or the wall panel has been opened (step S19 in FIG. 7), the controller 20 stops the alarm unit 21 and the processing sequence ends.

According to the fifth embodiment as described above, when the judgment switch is turned on to determine whether there is a possibility of condensation forming on the portion to be cooled 13a, it is judged whether or not there is a possibility of condensation forming on the portion to be cooled 13a, and notification is given by the judgment result being displayed, or by a sound or light. In other words, depending on the judgment switch being turned on, the judgment result of the possibility of condensation forming on the portion to be cooled 13a can automatically be understood. Accordingly, the waiting time from when the operation of the laser source 13 and the cooler 14 was stopped to when maintenance or repairs can begin is shortened. Specifically, in cases where there is a possibility of condensation forming on the portion to be cooled 13a if the door 12a or a wall panel is opened, the door 12a and the wall panels are locked and the waiting time until it is possible to open the door 12a and the wall panels is displayed. This ensures that the formation of condensation on the portion to be cooled 13a by mistake prevented.

The above indicated embodiments are typical. However the present invention is not limited to such embodiments and the shape, configuration and materials may be changed within a range not deviating from the spirit of the present invention.

The Effects of Aspects of the Invention

According to the first aspect of the invention, when carrying out maintenance or repairs in the laser device, the possibility of condensation forming on the portion to be cooled when the door or wall panels are opened can be easily and accurately determined. Namely, the time required from when the operation of the laser source and cooler are stopped to when the door or wall panel can be opened can be precisely understood. Accordingly, the waiting time from when the operation of the laser source and the cooler is stopped to when maintenance or repairs can be carried out can be suppressed to a minimum. Further, by reducing the waiting time, emergency repairs can be started early.

According to the second aspect of the invention, as notification is given to the outside of the housing that there is a possibility of condensation forming on the portion to be cooled if the door or a wall panel is opened, the possibility that a maintenance or repair person will mistakenly open the door or a wall panel early is reduced. Accordingly, damage by condensation caused to the laser source or peripheral components due to the door or a wall panel of the laser device being opened too early can be prevented.

Furthermore, according to the second aspect of the invention, when there is a possibility of condensation forming on the portion to be cooled if the door or a wall panel is opened, by detecting the action of at least one of the door and a wall panel being opened, the notification unit issues a warning that there is a possibility of condensation forming on the portion to be cooled. This ensures that a person carrying out maintenance or repairs will not carelessly open the door or wall panel of the laser device. According to the third aspect of the invention, when there is a possibility of condensation forming on the portion to be cooled if the door or a wall panel is opened, the door and wall panels are made unopenable. Accordingly, this further ensures that the door or wall panels of the laser device are not carelessly opened compared to the second aspect of the invention.

According to the fourth aspect of the invention, by installing an emergency release switch to unlock the door and wall panels, it is possible to deal with an emergency which requires the opening of the door or wall panel which takes precedence over the formation of condensation on the portion to be cooled.

According to the fifth aspect of the invention, as the waiting time until the door or wall panels may be opened is displayed, a maintenance or repair person may carry out other work during this period. Further, if an emergency repair is required, as the waiting time is known, a feeling of irritation can be reduced.

According to the sixth aspect of the invention, if it is judged that there is a possibility of condensation forming on the portion to be cooled, by heating the portion to be cooled, the portion to be cooled can quickly reach a temperature where condensation will not form thereon.

According to the seventh aspect of the invention, in addition to the effects brought about by the first to third, the fifth and sixth aspects, by switching on the judgment switch, the judgment result of the possibility of condensation forming on the portion to be cooled is automatically notified to the outside of the housing.

According to the eighth and ninth aspect of the inventions, by using at least one of a display unit, which displays the judgment result of the judgment unit, and an alarm unit, which issues a warning by at least one of light and a sound, as a notification unit, the judgment result of the judgment unit can easily be recognized outside the housing.

What is claimed is:

1. A laser device comprising:
   a cooler;
   a portion cooled by the cooler, the portion including a laser source generating heat; and
   a housing which has an airtight structure and houses at least the cooler and the portion cooled by the cooler, wherein a wall of the housing is openable by a door or a wall panel,
   wherein the laser device includes:
      a first temperature sensor provided in the housing to detect a temperature of the portion cooled by the cooler;
      a second temperature sensor and a humidity sensor provided outside the housing to respectively detect a temperature and humidity of air outside the housing; and
      a judgment unit which calculates a dew point of the air outside the housing based on the temperature of the air outside the housing detected by the second temperature sensor and the humidity of the air outside the housing detected by the humidity sensor, and judges a possibility of whether or not condensation will form on the portion cooled by the cooler due to the air outside the housing, by comparing the temperature of the portion cooled by the cooler detected by the first temperature sensor with the calculated dew point.

2. The laser device according to claim 1 further comprising:
   a detector which detects an act of opening at least one of the door and the wall panel; and
   a notification unit which notifies an outside of the housing of the judgment result of the judgment unit,
   wherein
   when the judgment unit has judged that there is a possibility of condensation forming on the portion cooled by the cooler, and the detector has detected the act of opening at least one of the door and the wall panel, the notification unit is configured to give notification that when the door or the wall panel is opened, condensation will form on the portion cooled by the cooler.

3. The laser device according to claim 1 further comprising:
   a locking device which locks the door and the wall panel while the judgment unit judges that there is a possibility of condensation forming on the portion cooled by the cooler.

4. The laser device according to claim 3 further comprising:
   an emergency release switch which releases the lock on the door and the wall panel which are locked by the locking device, regardless of the judgment of the judgment unit.

5. The laser device according to claim 1 further comprising:
   a calculation unit which calculates a time needed for the temperature of the portion cooled by the cooler to reach a temperature where there is no possibility of condensation forming on the portion cooled by the cooler by stopping an operation of the cooler when the judgment unit judges there is a possibility of condensation forming on the portion cooled by the cooler; and
   a notification unit which notifies the outside of the housing of the judgment result of the judgment unit, wherein
the notification unit displays the time calculated by the calculation unit as a time taken till the door or the wall panel can be opened.

6. The laser device according to claim 1 further comprising:
a heater which heats the portion cooled by the cooler when the judgment unit judges there is a possibility of condensation forming on the portion cooled by the cooler.

7. The laser device according to claim 1 further comprising:
an operation unit which includes a judgment switch which starts the judgment process of whether or not there is a possibility of condensation forming on the portion cooled by the cooler if the door or the wall panel is opened;
a notification unit which notifies the outside of the housing of the judgment result of the judgment unit;
a locking device which locks the door and the wall panel;
a calculation unit which calculates the time needed for the portion cooled by the cooler to reach a temperature where it will be judged that there is no possibility of condensation forming on the portion cooled by the cooler after stopping the operation of the cooler;
a heater which heats the portion cooled by the cooler; and
a controller which controls at least the cooler, the notification unit, the locking device and the heater,
wherein
the controller, according to an input of the judgment switch, stops the operation of the cooler,
and when the judgment unit judges there is a possibility of condensation forming on the portion cooled by the cooler, the controller instructs the notification unit to give notification that opening the door or the wall panel will generate condensation on the portion cooled by the cooler, instructs the locking device to lock the door and the wall panel, instructs the heater to heat the portion cooled by the cooler, and instructs the notification unit to display the time calculated by the calculation unit,
whereas, when the judgment unit judges there is no possibility of condensation forming in the portion cooled by the cooler, the controller instructs the heater to stop the heating operation, instructs the locking device to release the lock, and instructs the notification unit to give notification that it is acceptable to open the door or the wall panel.

8. The laser device according to claim 1, wherein:
the notification unit, comprises at least one of a display unit which displays the judgment result of the judgment unit and an alarm unit which emits a warning of at least one of light and sound corresponding to the judgment result of the judgment unit;
the display unit displays a warning that condensation will form on the portion cooled by the cooler if the door or the wall panel is opened when the judgment unit judges that there is a possibility of condensation forming on the portion cooled by the cooler; and
the alarm unit emits a warning of at least one of light and sound that condensation will form on the portion cooled by the cooler if the door or the wall panel is opened, when the judgment unit determines that there is a possibility of condensation forming on the portion cooled by the cooler.

9. The laser device according to claim 8, wherein:
the display unit, when the judgement unit determines that there is no possibility of condensation forming on the portion cooled by the cooler, displays that it is acceptable to open the door or the wall panel; and
the alarm unit emits at least one of a sound and light different from those emitted when the judgement unit determines that there is a possibility of condensation forming on the portion cooled by the cooler, to notify that it is acceptable to open the door or the wall panel when the judgement unit determines that there is no possibility of condensation forming on the portion cooled by the cooler.

* * * * *